United States Patent [19]
Miyazaki et al.

[11] Patent Number: 5,157,699
[45] Date of Patent: Oct. 20, 1992

[54] WATCHDOG TIMER EMPLOYING PLURAL COUNTERS AND DISCRIMINATOR FOR DETERMINING NORMAL OPERATING FREQUENCY RANGE OF INPUT

[75] Inventors: Hajime Miyazaki; Masaaki Handa; Taisuke Uehara; Tsukasa Muranaka, all of Suwa, Japan

[73] Assignee: Seiko Epson Corporation, Tokyo, Japan

[21] Appl. No.: 644,704

[22] Filed: Jan. 23, 1991

[30] Foreign Application Priority Data

Jan. 23, 1990 [JP] Japan ................................ 2-11843
Jan. 31, 1990 [JP] Japan ................................ 2-19243
Jun. 29, 1990 [JP] Japan ............................... 2-170285
Jun. 29, 1990 [JP] Japan ............................... 2-170286

[51] Int. Cl.⁵ ...................... H03K 21/40; H03K 5/153
[52] U.S. Cl. ........................................ 377/28; 377/39; 328/138; 328/133; 328/140
[58] Field of Search ...................... 377/39, 28, 55; 328/133, 138

[56] References Cited

U.S. PATENT DOCUMENTS 3,723,889  3/1973  Oberst ................................. 377/28
3,873,928  3/1975  Lafuze ................................ 328/133
4,089,060  5/1978  Mitchell .............................. 377/39
4,255,809  3/1981  Hillman .............................. 377/28
4,468,796  8/1984  Suga .................................. 377/39
4,649,886  3/1987  Igashira et al. .................... 123/498
4,686,483  8/1987  Isshiki et al. ...................... 377/39

FOREIGN PATENT DOCUMENTS

112678  4/1990  Japan .

Primary Examiner—John S. Heyman
Attorney, Agent, or Firm—Gregory D. Ogrod

[57] ABSTRACT

A watchdog timer capable of detecting clock signals when the opening frequency of a frequency source drifts lower or higher than a normal desired operating range, increasing circuit safety and reliability. The timer uses first and second clock oscillation circuits to generate first and second signals of frequencies $f_1$ and $f_2$ which are then divided by $1/N_1$ and $1/N_2$ in first and second frequency dividers, respectively. Third and fourth frequency dividers are used to divide the second frequency signal $f_2$ by $1/N_3$ and $1/N_4$, respectively. A scale of $N_5$ counter is connected to receive the $f_1/N_1$ frequency signal as a clock input and the $f_2/N_3$ frequency signal as a reset input, and provides an output signal at a frequency of $(f_1/N_1)/N_5$ which is less than $f_2/N_3$ when the clock circuits are operating under normal conditions. A scale of $N_6$ counter is connected to receive the $f_2/N_4$ frequency signal as a clock input and the $f_1/N_2$ frequency signal as a reset input, and provides an output signal at a frequency of $(f_2/N_4)/N_6$ which is less than $f_1/N_2$ under normal conditions. A discrimination circuit is connected to monitor the outputs of the scale of $N_5$ and $N_6$ counters to determine the presence of a fault by detecting when either output no longer meets the associated relationship.

8 Claims, 7 Drawing Sheets

WATCHDOG TIMER EMPLOYING PLURAL COUNTERS AND DISCRIMINATOR FOR DETERMINING NORMAL OPERATING FREQUENCY RANGE OF INPUT

BACKGROUND OF THE INVENTION

The present invention relates to frequency control apparatus and more particularly to a watchdog or safety timer that detects abnormal operation of a circuit incorporating a clock oscillator.

Many electronic devices incorporate internal clock circuits as standard time bases for maintaining particular timing relationships or for synchronization with other devices. To assure proper operation or to detect any abnormality in timing, a form of watchdog timer is sometimes used. Conventional watchdog timers include mono multivibrators that use a clock signal as a trigger signal and timers that use the clock signal as a reset. Due to the operational features of these devices such circuits are capable of determining when the clock frequency has dropped below a preselected "normal" level. However, these circuits cannot detect when the clock frequency has increased beyond a desirable operating level. The use of condensers as part of a discharge/recharge cycle and detection process fails at higher frequencies because the period of operation becomes too short to allow sufficient changes in voltage level to be detected. These and other problems have prevented adequate safety and reliability in watchdog timers.

SUMMARY OF THE INVENTION

In accordance with one aspect of the present invention, a watchdog timer is provided that has a first clock oscillation circuit for generating a first oscillation frequency $f_1$, a second clock oscillation circuit for generating a second oscillation frequency $f_2$, a first frequency divider circuit for subjecting the first oscillation frequency $f_1$ to $1/N_1$ frequency division, a second frequency divider circuit for subjecting the first oscillation frequency $f_1$ to $1/N_2$ frequency division, a third frequency divider circuit for subjecting the second oscillation frequency $f_2$ to $1/N_3$ frequency division, and a fourth frequency divider circuit for subjecting the second oscillation frequency $f_2$ to $1/N_4$ frequency division. The watchdog timer further includes a scale of $N_5$ counter for receiving the first frequency divider circuit signal of output frequency $f_1/N_1$ as a clock input and the signal of the third frequency divider circuit of output frequency $f_2/N_3$ as a reset input and set to $(f_1/N_1)/N_5 < f_2/N_3$ under normal conditions, a scale of $N_6$ counter for receiving the signal of the fourth frequency divider circuit output frequency $f_2/N_4$ as a clock input and the signal of frequency $f_1/N_2$ as a reset input and set to $(f_2/N_4)/N_6 < f_1/N_2$, and a discrimination circuit for determining the presence of a fault in accordance with the output of the scale of $N_5$ counter or/and the scale of $N_6$ counter. The function of the fourth frequency divider circuit may be concurrently served by the third frequency circuit.

According to another aspect of the present invention, the watchdog timer further includes a counter check circuit for detecting a change between the outputs of one of a plurality of flip-flop circuits forming the scale of $N_5$ counter or the scale of $N_6$ counter before and after application of a reset signal to the flip-flop circuits.

The counter check circuit includes a D-type flip-flop circuit for receiving a clock signal which leads in phase the signal for resetting the flip-flop circuits of the scale of $N_5$ counter or the scale of $N_6$ counter and the output of one of the flip-flop circuits at the counter check circuit data terminal, a NAND gate circuit for receiving the output and the inverted output of the D-type flip-flop circuit, and another D-type flip-flop circuit for receiving the output of the NAND circuit at a data terminal and the reset signal at a clock terminal.

In the watchdog timer, when any fault occurs in any of the first and second oscillation circuits or any of the first to the fourth frequency divider circuits so that the corresponding output frequency becomes higher or lower than a given value, the fault is detected by the scale of $N_5$ or $N_6$ counter. On the other hand, when a fault occurs in operation of the scales of $N_5$ or $N_6$ counter, the counter check circuit detects and announces the fault.

Other objects and attainments together with a fuller understanding of the invention will become apparent and appreciated by referring to the following description and claims taken in conjunction with the accompanying drawings.

DESCRIPTION OF THE INVENTION

The invention represents a watchdog or safety timer for use in reliability sensitive or highly safety conscious environments such as for micropump supervisory control systems used in various medical applications. The present watchdog timer remedies problems previously encountered in the art when the frequency of clock signals exceeded normal operating frequencies. In this case detection of abnormal operation could not be adequately or reliably obtained. The present invention overcomes this limitation by providing a timer that detects not only when the frequency drops below normal levels but rises above normal levels as well.

Figure 1:
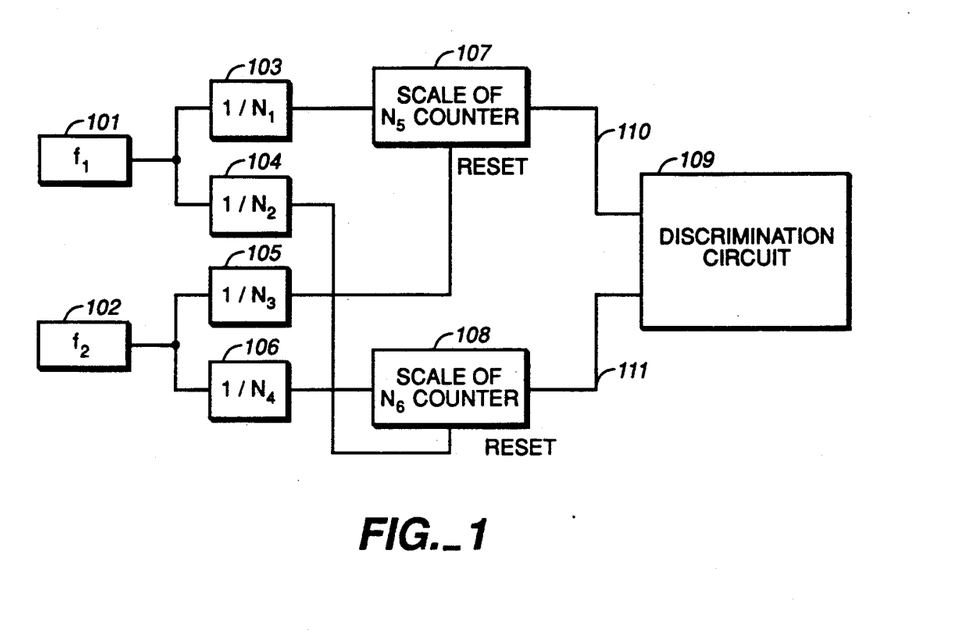
FIG. 1 is a block diagram of the watchdog timer according to an embodiment of the present invention.

Referring to the block diagram of the watchdog timer according to FIG. 1, a watchdog timer is shown using a first clock oscillation circuit 101 having oscillation frequency $f_1$, a second clock oscillation circuit 102 having an oscillation frequency $f_2$, frequency divider circuit 103 for subjecting the frequency $f_1$ to $1/N_1$ frequency division, frequency divider circuit 104 for subjecting frequency $f_2$ to $1/N_2$ frequency division, frequency divider circuit 105 for subjecting frequency $f_2$ to $1/N_3$ frequency division, and frequency divider circuit 106 for subjecting frequency $f_2$ to $1/N_4$ frequency division. The timer also employs scale of $N_5$ counter 107 for receiving the signals of frequency $f_1/N_1$ from frequency divider circuit 103 as its clock input and the signal of frequency $f_2/N_3$ from frequency divider circuit 105 as its reset input, and a scale 108 of $N_6$ counter for receiving signals of frequency $f_2/N_4$ as its clock input and the signal of frequency $f_1/N_2$ from frequency divider circuit 104 as its reset input, along with a discrimination circuit 109 for discriminating output signal 110 of the scale of $N_5$ counter 107 or output signal 111 of the scale of $N_6$ counter 108.

In the operation of the watchdog timer, the scale of $N_5$ counter 107 receives signals of frequency $f_1/N_1$ as its clock input to count and thereby generate output signal 110 for every count of $N_5$. In the normal operating condition, however, the scale of $N_5$ counter 107 is reset by a signal of frequency $f_2/N_3$ having a relation $(f_1/N_1)/N_5 < f_2/N_3$ and, therefore, no output signal 110 is generated.

The scale of $N_6$ counter 108 receives signals of frequency $f_2/N_4$ as its input clock to count and thereby generates output signal 111 for every count of $N_6$. In the normal operating condition, however, the scale of $N_6$ counter 108 is reset by the signal of frequency $f_1/N_2$ having a relation $(f_2/N_4)/N_6 < f_1/N_2$ and, therefore, no output signal 111 is generated.

When both output signals 110 and 111 are not applied, discrimination circuit 109 determines that circuit operation is normal. When first clock oscillation circuit 101 or frequency divider circuit 104 becomes faulty so that frequency $f_1/N_2$ is decreased, no reset signal is supplied to the scale of $N_6$ counter 108 at the given timing so output signal 111 is generated and applied to discrimination circuit 109 which in turn determines that the circuit operation is not normal. Similarly, when a fault occurs in second clock signal oscillation circuit 102 or frequency divider circuit 105 so that frequency $f_2/N_3$ is decreased, output signal 110 is generated from the scale of $N_5$ counter 107 and applied to discrimination circuit 109 which, in turn, determines that circuit operation is not normal.

When a fault occurs in first oscillation circuit 101 or frequency divider circuit 103 so that frequency $f_1/N_1$ is increased, output signal 110 is generated from the scale of $N_5$ counter 107 and applied to discrimination circuit 109 which, in turn, determines that circuit operation is not normal. When a fault occurs in second clock oscillation circuit 102 or frequency divider circuit 106 so that frequency $f_2/N_4$ is increased, output signal 111 is generated from the scale of $N_6$ counter 108 and applied to discrimination circuit 109 which in turn determines that circuit operation is not normal.

Figure 2:
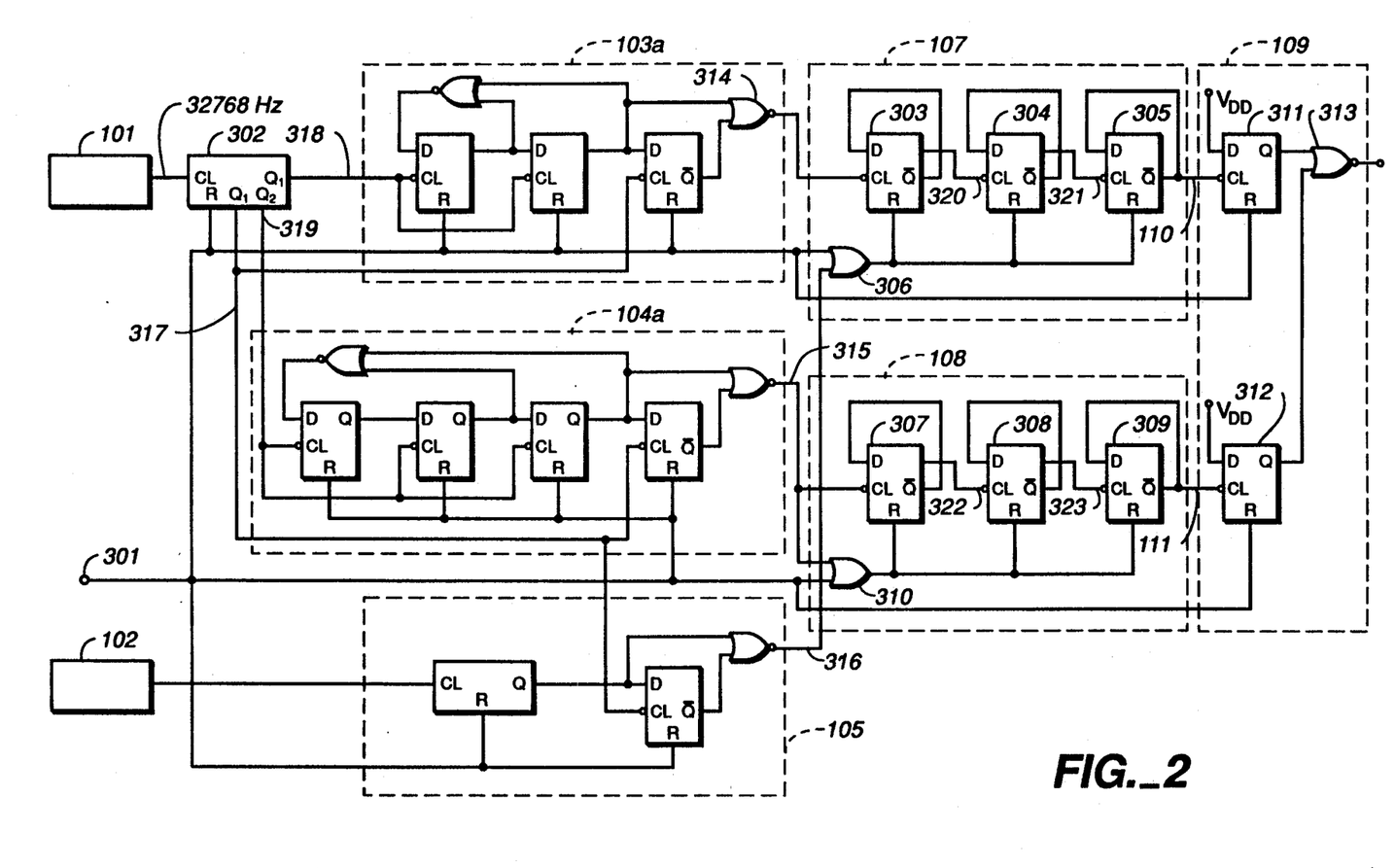
FIG. 2 is a block diagram showing details of the embodiment of FIG. 1.

Referring to FIG. 2, a circuit diagram showing details of the watchdog timer of FIG. 1, is shown having first and second clock oscillation circuits 101, 102 and with their respective oscillation frequencies $f_1$, $f_2$ here set to 32768 Hz, selected. A frequency divider circuit 103a subjects clock signals of 32768 Hz from first clock oscillation circuit 101 to frequency division and generate, clock signals 318 of 256 Hz, clock signals 319 of 64 Hz and clock signals of a frequency higher than clock signals 318 and 319. The frequency divider circuit 103a for subjecting the input signals to $\frac{1}{3}$ frequency division is associated with frequency divider circuit 302 so as to subject frequency $f_1$ to 1/384 frequency division ($N_1 = 384$) and to generate clock signals 314 of 256/3 Hz. A frequency divider circuit 104a subjects input signals to 1/5 frequency division and is associated with frequency divider circuit 302 so as to subject frequency $f_2$, of 32768 Hz, to a 1/2560 frequency division ($N_2 = 2560$) and to generate clock signals 315 of 64/5 Hz. Frequency divider circuit 105 subjects the input signals to $1/N_3$ frequency division in this embodiment and concurrently serves the function of frequency divider circuit 106 whereby with $N_3 = N_4 = 1024$, clock signals of 32768 Hz are subjected to 1/1024 frequency division to generate clock signals 316 of 32 Hz.

It is to be noted that clock signals 317 are clock pulses for converting clock signals 314, 315, and 316 to pulse signals of smaller widths using the internal differentiation circuits of frequency divider circuits 103, 104, and 105.

Scale of $N_5$ counter 107 comprises D-type flip-flops 303, 304, and 305 thus forming a scale of four counter ($N_5 = 4$) to generate output signal 110. When a system reset signal 301 or clock signal 316 goes to a high or H level, D-type flip-flops 303, 304, and 305 are reset by OR gate 306.

Scale of $N_6$ counter 108 including D-type flip-flops 307, 308, and 309 forms a scale of four counter ($N_6 = 4$) which generates output signal 111. When system reset signal 301 or clock signal 315 goes to an H level, D-type flip-flops 307, 308, and 309 are reset by OR circuit 310.

The discrimination circuit 109 including D-type flip-flops 311 and 312 and its output 324 goes to L level when output signal 110 or 111 goes from H level to L level.

Figure 3:
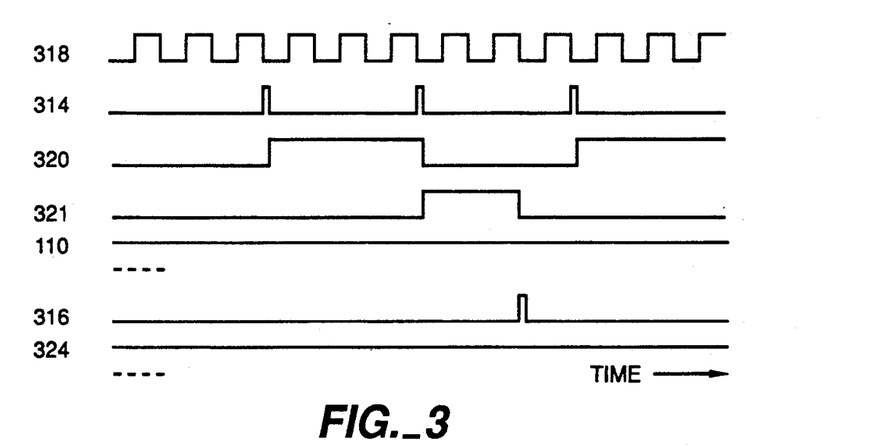
FIGS. 3, 4 and 5 are timing charts showing the operations of the watchdog timer of FIG. 2.

Referring now to FIG. 28 which depicts a timing chart showing normal operation of the present embodiment, all circuits are first reset by system reset signal 301. While the scale of $N_5$ counter 107 counts clock signals 314 (Here 256/3 Hz), in the normal condition $(f_1/N_1)/N_5 = 32768/384/4$ Hz = 21.3 Hz, and 21.3 Hz $< f_2/N_3 = 32768/1024 = 32$ Hz, and counter 107 is reset by clock signal 316 before counting four clock signals, thereby causing output signal 110 to remain at the H level.

While the scale of $N_6$ counter 108 counts clock signals 316 (Here 32 Hz), in the normal condition $(f_2/N_4)/N_6 = 32768/1024/4$ Hz = 8 Hz $< f_1/N_2 = 32768/2560 = 12.8$ Hz, and counter 108 is reset by clock signal 315 before counting four clock signals, thereby causing output signal 111 to remain at the H level. Therefore, output signal 324 of discrimination circuit 109 is maintained at the H level.

Figure 4:
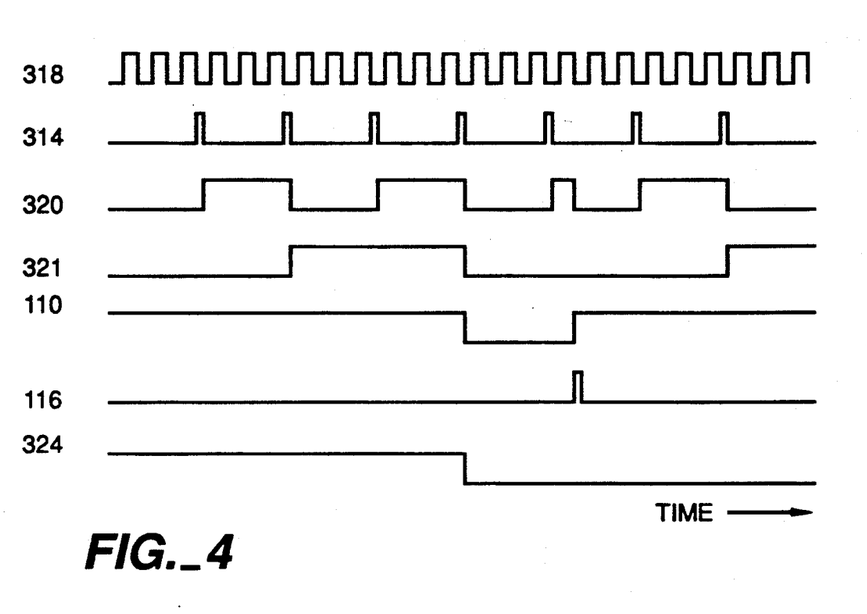

FIG. 4 is a timing chart showing operation when first clock oscillation circuit 101 produces harmonic oscillations. When first clock oscillation circuit 101 produces harmonic oscillations so that the oscillation frequency becomes two times that encountered under normal operating conditions or 65536 Hz, the resulting frequency count $(f_1/N_1)/N_5 = 65536/384/4$-Hz = 42.7 Hz, and 42.7 Hz $> f_2/N_3$ 32768/1024 = 32 Hz, and the scale of $N_5$ counter 107 only counts four clock signals before being reset by clock signal 316. Thus, output signal 110 changes from an H level to an L level and is latched by D-type flip-flop circuit 311 causing output 324 of discrimination circuit 109 to go to the L level and detect the occurrence of a circuit fault.

In the same way, when $(f_2/N_1)/N_5 > f_2/N_3$ for any other reason, such as a decrease in oscillation frequency of second clock oscillation circuit 102, the occurrence of a fault in the circuit is detected.

Figure 5:
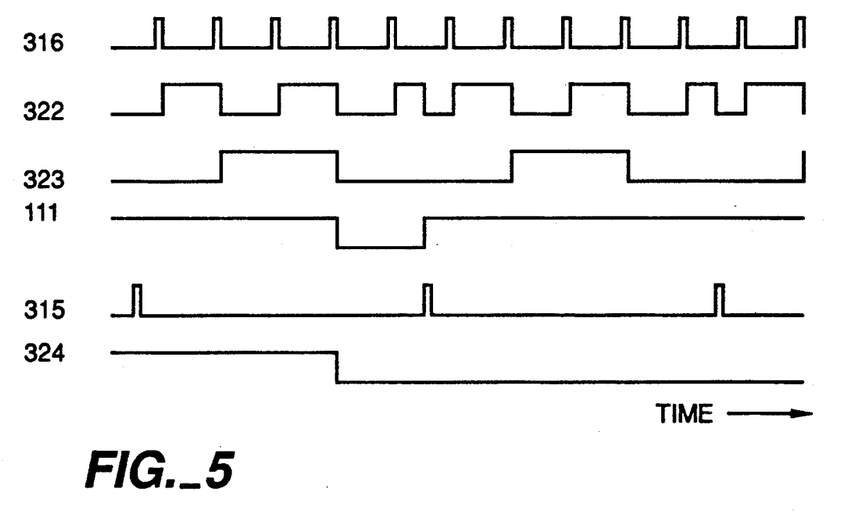

FIG. 5 is a timing chart showing circuit operation when second clock oscillation circuit 102 produces harmonic oscillations so that oscillation frequency $f_2$ becomes twice the normal condition, i.e. 65536 Hz. In this case, $(f_2/N_4)/N_6 = 65536/1024/4$ Hz = 16 Hz, and 16 Hz $> f_1/N_2 = 32768/2560 = 12.8$ Hz so that the scale of four counter 108 counts four clock signals before being reset by clock signal 315. Thus, output signal 111 goes from an H level to an L level and is latched by D-type flip-flop circuit 312 causing output 324 of discrimination circuit 109 to go to L level and thereby detect the occurrence of a circuit fault.

In like manner, when $(f_2/N_4)/N_6 > f_1/N_2$ due to any other cause, such as a decrease in the oscillation frequency of first clock oscillation circuit 101, the occurrence of a fault is detected.

Figure 6:
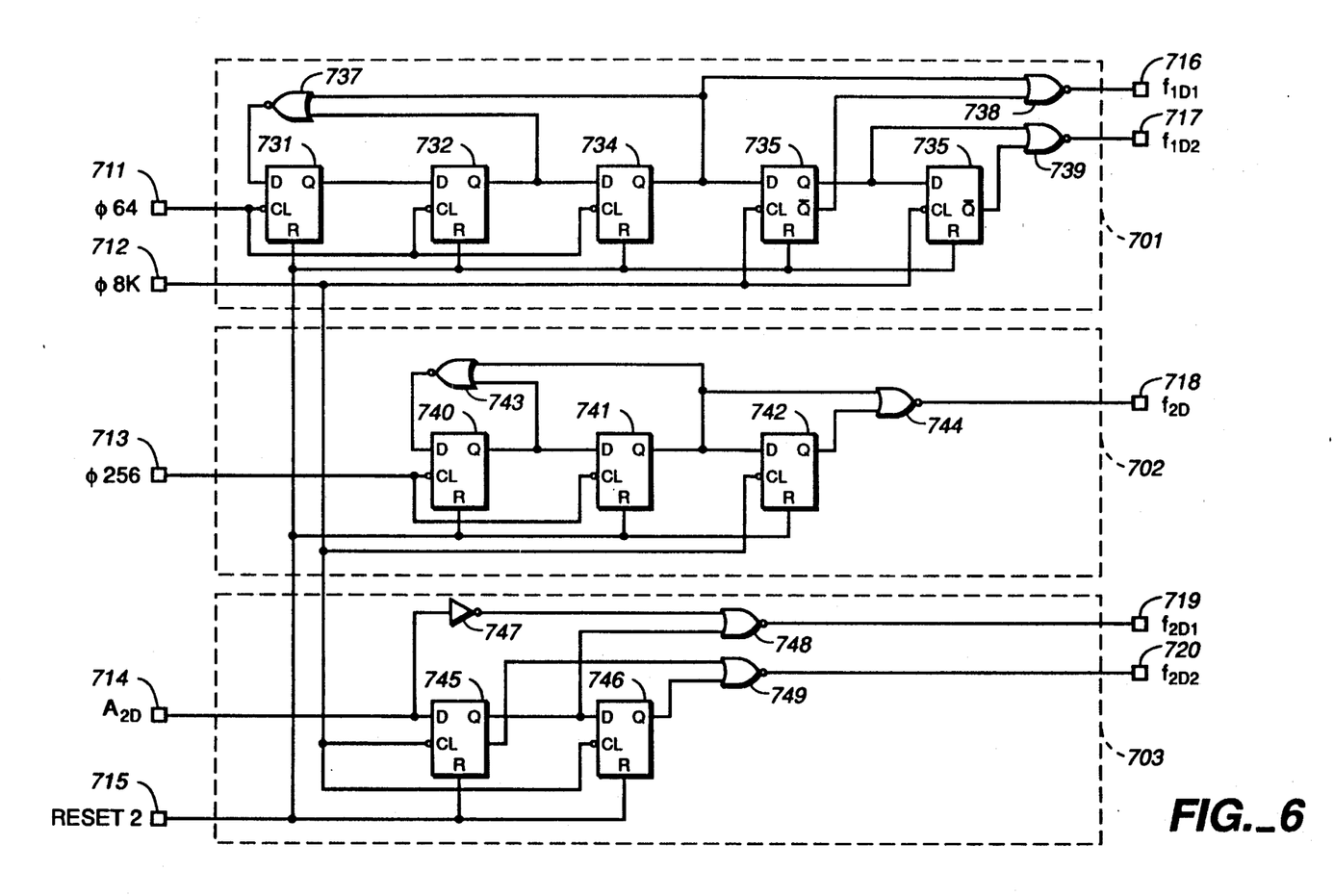
FIGS. 6 and 7 are block diagrams of a watchdog timer according to another embodiment of the present invention.
Figure 7:
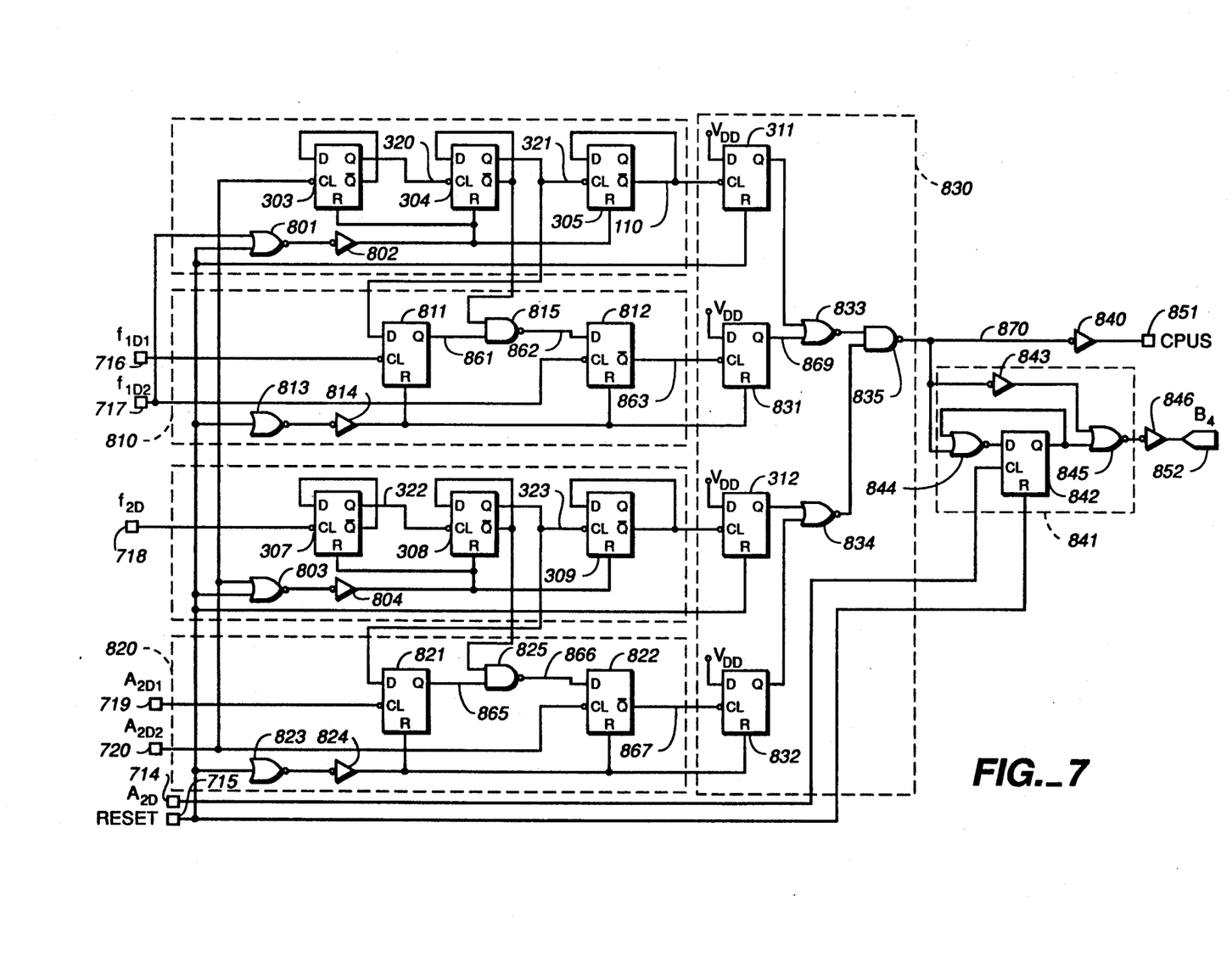

FIGS. 6 and 7 are circuit diagrams of a watchdog timer constructed according to another embodiment of the present invention, with FIG. 6 depicting the frequency divider circuit section and FIG. 7 showing a fault discrimination processing section. In this embodiment, the ability to check the operation of the scale of $N_5$ counter 107, the scale of $N_6$ counter 108, and an output stage is added to the embodiment of FIG. 2.

In FIG. 6, frequency divider circuit 701 subjects input signals to 1/5 frequency division and includes D-type flip-flop circuits 731–736 and NOR gates 737–739. Clock signals 711, having a frequency of 64 Hz, and clock signals 712 of 8 KHz are applied to frequency divider circuit 701, thus clock signals 711 are subjected to 1/5 frequency division, thereby generating clock signals 716, 717 which are slightly shifted in phase from each other. A frequency divider circuit 702 subjects input signals to ⅓ frequency division and includes D-type flip-flop circuits 740–742 and NOR gates 743, 744. Frequency divider circuit 702 receives and subjects clock signals 713 of frequency 256 Hz to ⅓ frequency division thereby generating clock signals 718 of approximately 85.3 Hz. A shift circuit 703 including D-type flip-flop circuits 745, 746 and NOR gates 747–749, and receives clock signals 714 of 32 Hz and generates clock signals 719, 720 slightly shifted in phase from each other.

It is to be noted that clock signals 711–713 are signals produced through frequency division of the output of first clock oscillation circuit 101 as shown in FIG. 2. Clock signals 714 are signals produced through the frequency division of the output of the second clock oscillation circuit 102. First clock oscillation circuit 101 and second clock oscillation circuit 102 are incorporated in different ICs. Circuit 101, frequency divider circuits, not shown, for producing clock signals 711–713 and the circuits of FIGS. 6 and 7 are incorporated in a first IC($1C_1$). Second clock oscillation circuit 102 and the circuits for generating clock signals 714 and 715 are incorporated in a second IC($1C_2$). Signal 715 is a reset signal generated from the second IC($1C_2$) to reset the D-type flip-flop circuits of circuits 701 to 703.

Referring to FIG. 7, gate circuits 801, 802 provide a reset signal for D-type flip-flop circuits 303–305 of the scale of $N_6$ counter 108, and gate circuits 803, 804 provide a reset signal for D-type flip-flop circuits 307–309 of the scale of $N_5$ counter 107. A counter check circuit 810 provides for checking the operation of the scale of $N_6$ counter 108 includes D-type flip-flop circuits 811, 812 and gate circuits 813–815, and a counter check circuit 820 for checking operation of the scale of $N_5$ counter 107 includes D-type flip-flop circuits 821, 822 and gate circuits 823–825 as shown.

A discrimination circuit 830 including, in addition to D-type flip-flop circuits 311, 312 of FIG. 2, D-type flip-flop circuits 831, 832 for latching the outputs of counter check circuits 810, 820 and gate circuits 833–835, respectively, are also depicted. Output stage check circuit 841 includes D-type flip-flop circuit 842 and gate circuits 843–845. Gate circuit 846 is arranged on the output side of output stage check circuit 841. A detection signal 851 is taken into the first IC($1C_1$) and a detection signal 852 is sent to the second IC($1C_2$).

Figure 8:
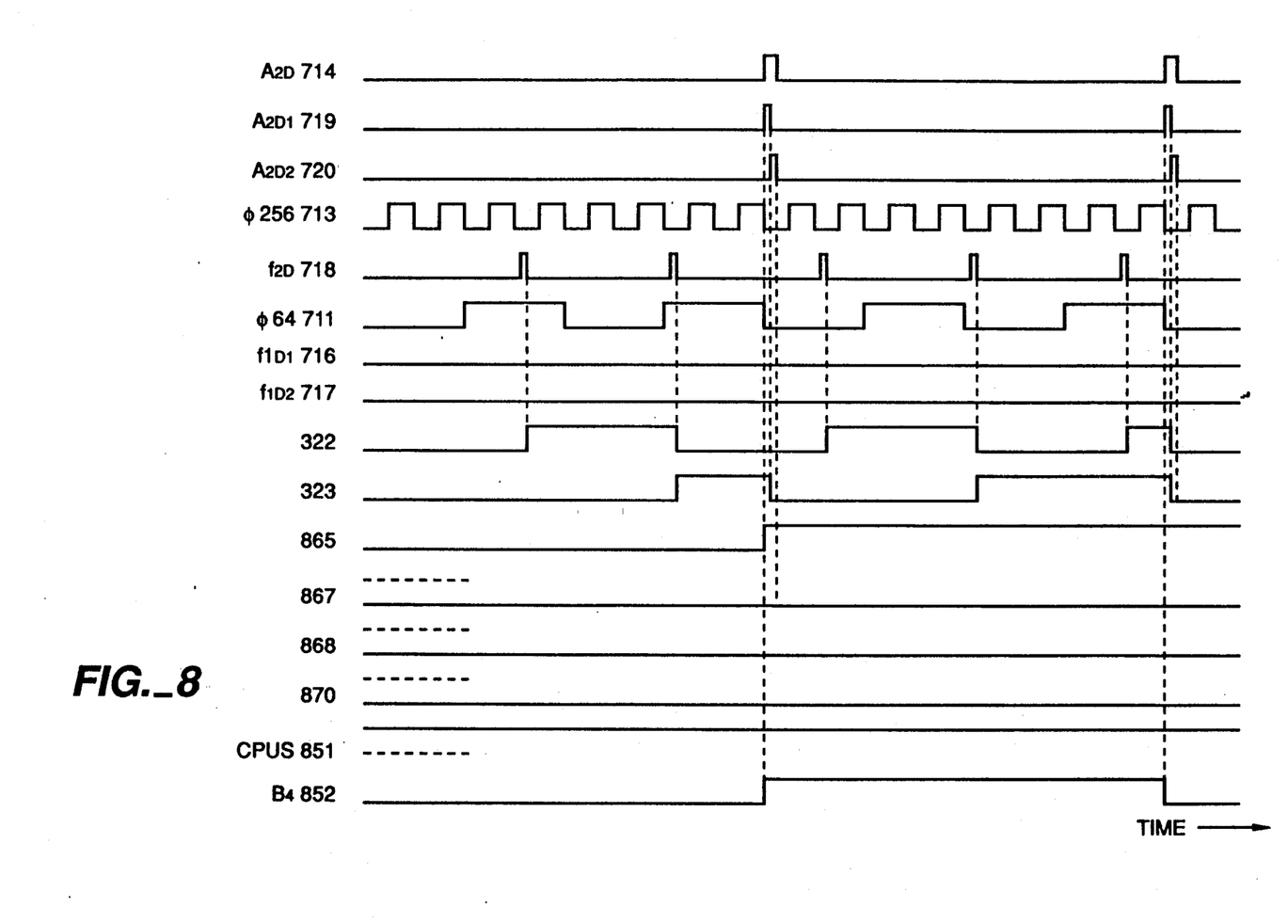
FIGS. 8 and 9 are timing charts showing the operations of the embodiments of FIGS. 6 and 7, respectively.

FIG. 8 is a timing chart showing the clock signals of FIG. 6 and operation of counter check circuit 820 of FIG. 7. Clock signals 714, 719, 720, 713, 718, 711, 716, 717 are each applied as shown. For instance, D-type flip-flop circuit 307 of the scale of $N_5$ counter 107 receives clock signals 718 and applies output signals 322 as clock signals to D-type flip-flop circuit 308. Output signals 323 of D-type flip-flop circuit 308 are applied as clock signals to D-type flip-flop circuit 309 and are also applied to the data terminals of D-type flip-flop circuit 821 of counter check circuit 820. The inverted signals of output signal 323 are applied to gate circuit 825.

When clock signal 719 is applied as a clock signal to D-type flip-flop circuit 821 with output signal 323 in the H state, output 865 goes to the H level. Then, when clock signal 720 is applied to the reset terminal of D-type flip-flop circuit 308, output signal 323 goes to the L level and the inverted signal is applied to gate circuit 825. Signal 865 ("H") and the inverted signal of signal 323 ("H") are applied to gate circuit 825 so that output signal 866 goes to the L level and is applied as a data signal to D-type flip-flop circuit 822. At this time, clock signal 720 is also applied to the clock terminal of D-type flip-flop circuit 822 and, thus, output signal 867 of circuit 822 remains at the H level.

When there is a change between the outputs of D-type flip-flop circuit 308 before and after its resetting, output signal 867 of D-type flip-flop circuit 822 remains at the H level indicating that the scale of $N_5$ counter 107 is operating properly.

Output signal 867 of D-type flip-flop circuit 822 is inputted to D-type flip-flop circuit 832 as a clock signal and the output signal, the L level at this time, is sent to gate circuit 834, 835 so that if there is no fault in the other circuits maintaining output signals of D-type flip flop circuits 311, 312, and 831 at the L level, output signal 870 of gate circuit 835 also goes to the L level and detection signal 851, the H level at this time, is sent to the first IC ($1C_1$) through gate circuit 840.

In the output stage fault detecting circuit 841, the output signal 870 of gate circuit 835, is applied to gate circuit 844 so that an inverted signal is applied to the data terminal of D-type flip-flop circuit 842 whose clock signal terminal receives clock signal 714, and whose output is applied to gate circuits 844 and 845. When the output of gate circuit 845 is delivered as detection signal 852 to second IC ($IC_2$) through gate circuit 846, signal 852 is repeatedly switched H and L in synchronization with signals 714. When a fault occurs in output stage fault detecting circuit 841, the output signal assumes one or the other of the H and L levels and the fault is detected.

If output signal 323 of D-type flip-flop circuit 308 fails to change from the H level to the L level when a reset signal is applied to the scale of $N_5$ counter 107, the following operation takes place. When clock signal 719 is applied to the clock terminal of D-type flip-flop circuit 821 with output signal 323 in the H state, output 865 goes to the K level. When clock signal 720 is applied to the reset terminal of D-type flip-flop circuit 308, output signal 865, which should go to the L level, fails to do so. Output signal 865 ("H") and the inverted signal of signal 323 ("L") remain as applied to gate circuit 825, output signal 866 becomes "H" and output signal 866 is applied as a data signal to D-type flip-flop circuit 822. Clock signal 720 is applied to the clock terminal of D-type flip-flop circuit 822 and, thus, output signal 867 of circuit 822 goes to the L level. If there is no difference between outputs before and after resetting of D-type flip-flop circuit 308, output signal 867 of D-type flip-flop circuit 822 goes to the L level indicating that the scale of $N_5$ counter 107 is not operating properly.

Output signal 867 of D-type flip-flop circuit 822 is inputted as the clock signal to D-type flip-flop circuit 832 and the output signal, the H level at this time, is delivered to gate circuits 834 and 835. Thus, even if other circuits are not faulty and output signals of D-type flip-flop circuits 311, 312, and 831 are at the L level, output signal 870 of gate circuit 835 goes to the H level and L-level detection signal 851 is delivered to the first IC($1C_1$) through gate 840.

Figure 9:
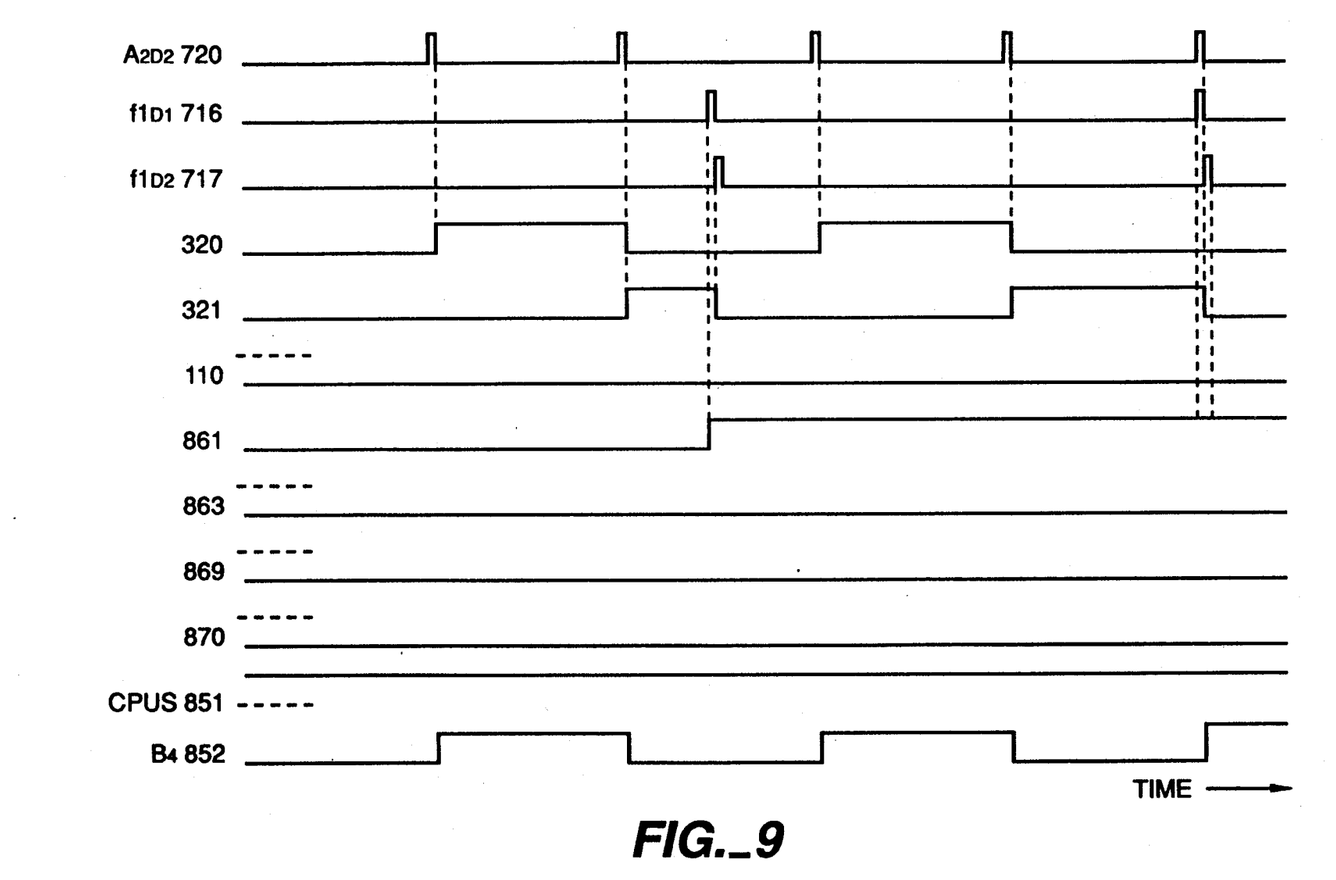

Referring to FIG. 9, counter check circuit 810 is the same in operation as previously mentioned counter check circuit 820 so that output signal 321 of D-type flip-flop circuit 304 is applied as a clock signal to the following D-type flip-flop circuit 305 and is also applied to the data terminal of the D-type flip-flop circuit 811 in counter check circuit 810. The inverted signal of output signal 321 is applied to gate circuit 815. With output signal 321 in the "H" state, when clock signal 716 is applied to the clock terminal of D-type flip-flop circuit 811, output signal 861 goes to the H level. When clock signal 717 is applied to the reset terminal of D-type flip-flop circuit 304, output signal 321 goes to the L level and applies the inverted signal of output signal 321 to gate circuit 815. Output signal 861 ("H") and the inverted signal of output signal 321 ("H") are applied to gate circuit 815 so that output signal 862 goes to the L level and is applied as a data signal to D-type flip-flop circuit 812. Clock signal 717 is also applied to the clock terminal of D-type flip-flop circuit 812 so that output signal 863 of circuit 812 remains at the H level indicating that the scale of $N_6$ counter 108 is operating properly.

If output signal 321 of D-type flip-flop circuit 304 fails to change from the H level to the L level when a reset signal is applied to the scale of $N_6$ counter 108, output signal 861 ("H") and the inverted signal of output signal 321 ("L") are continuously applied to gate circuit 815 and output signal 862 remains at the H level, thereby applying output signal 862 as a data signal of D-type flip-flop circuit 812. At this time, clock signal 717 is also applied to the clock terminal of D-type flip-flop circuit 812 and output signal 863 of circuit 812 goes to the L level. As a result, it is known that the scale of $N_6$ counter 108 is not operating properly.

As previously described in connection with the watchdog timer, when any fault occurs in the circuits so that the frequency of frequency divided clock signals is increased or decreased, a faulty condition is readily detected and indicated. The use of two clock signal oscillation circuits permits mutual confirmation of the two circuits and is also arranged to check operation of the faulty operation detecting circuit, thereby further enhancing reliability. The present invention is best suited as control circuitry for applications requiring high reliability or self-diagnosis functioning such as medical injection, measuring and security devices.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A watchdog timer useful for monitoring when the operating frequency of a frequency source drifts outside of a normal desired operating range, comprising:

a first clock oscillation circuit for generating a first oscillation frequency $f_1$;

a second clock oscillation circuit for generating a second oscillation frequency $f_2$;

a first frequency divider circuit for subjecting said first oscillation frequency $f_1$ to $1/N_1$ frequency division;

a second frequency divider circuit for subjecting said first oscillation frequency $f_1$ to $1/N_2$ frequency division;

a third frequency divider circuit for subjecting said second oscillation frequency $f_2$ to $1/N_3$ frequency division;

a fourth frequency driver circuit for subjecting said second oscillation frequency $f_2$ to $1/N_4$ frequency division;

a scale of $N_5$ counter for receiving as a clock input a signal of output frequency $f_1/N_1$ from said first frequency divider circuit and as a reset input a signal of an output frequency $f_2/N_3$ from said third frequency divider circuit and having an output that meets a preset relationship of $(f_1/N_1)/N_5 < f_2/N_3$ when said clock circuits are operating under normal conditions;

a scale of $N_6$ counter for receiving as a clock input a signal of output frequency $f_2/N_4$ from said fourth frequency divider circuit and as a reset input a signal of an output frequency $f_1/N_2$ from said second frequency divider circuit and having an output that meets a preset relationship of $(f_2/N_4)/N_6 < f_1/N_2$ when said clock circuits are operating under normal conditions; and a discrimination circuit responsive to an output from either said scale of $N_5$ counter or said scale of $N_6$ counter to determine the presence of a fault by detecting when either of said counter outputs no longer meets the associated relationship.

2. The watchdog timer apparatus of claim 1, further comprising a counter check circuit for detecting the presence of a change between outputs of a selected one of a plurality of flip-flop circuits forming said scale of $N_5$ counter before and after the application of a reset signal to said flip-flop circuits.

3. The watchdog timer circuit of claim 2, wherein said counter check circuit includes a first D-type flip-flop circuit for receiving as a clock signal a signal leading in phase said reset signal applied to said flip-flop circuits of said scale of $N_5$ counter and receiving an output of said one flip-flop circuit, a NAND gate circuit for receiving an output of said first D-type flip-flop circuit and an inverted output from said one flip-flop circuit, and a second D-type flip-flop circuit for receiving an output of said NAND gate circuit and said reset signal.

4. The watchdog timer apparatus of claim 1, further including a counter check circuit for detecting the presence of a change between outputs of a selected one of a plurality of flip-flop circuits forming said scale of $N_6$ counter before and after the application of a reset signal.

5. The watchdog timer apparatus of claim 4, wherein said counter check circuit includes a third D-type flip-flop circuit for receiving as a clock signal a signal leading in phase said reset signal applied to said flip-flop circuit of said scale of $N_6$ counter and an output of said one flip-flop circuit, a NAND gate circuit for receiving an output of said third D-type flip-flop circuit and an inverted output from said one flip-flop circuit, and a fourth D-type flip-flop circuit for receiving an output of said NAND gate circuit and said reset signal.

6. The watchdog timer of claim 5, further comprising timing means for receiving outputs from said second clock oscillation circuit and for generating first and second output signals at a preselected like frequency and shifted in phase from each other by a predetermined amount.

7. The watchdog timer of claim 3, further comprising timing means for receiving outputs from said first clock oscillation circuit and for generating first and second output signals at a preselected like frequency and shifted in phase from each other by a predetermined amount.

8. The watchdog timer of claim 1, wherein each of said $1/N_1$, $1/N_2$, $1/N_3$, and $1/N_4$ frequency divider circuits comprise a plurality of flip-flop circuits.

* * * * *